US008148210B1

(12) United States Patent
Fuergut et al.

(10) Patent No.: US 8,148,210 B1
(45) Date of Patent: Apr. 3, 2012

(54) METHOD FOR FABRICATING A SEMICONDUCTOR CHIP PANEL

(75) Inventors: Edward Fuergut, Dasing (DE); Markus Fink, Zell (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/880,782

(22) Filed: Sep. 13, 2010

(51) Int. Cl.
*H01L 21/00* (2006.01)
*B23P 23/00* (2006.01)
*B28B 1/54* (2006.01)

(52) U.S. Cl. ............ 438/127; 257/E21.502; 29/564.6; 425/5

(58) Field of Classification Search .......... 438/127; 425/5; 29/564.6; 257/E21.502
See application file for complete search history.

(56) References Cited

U.S. PATENT DOCUMENTS

| | | | | |
|---|---|---|---|---|
| 4,460,537 | A * | 7/1984 | Heinle | 264/272.17 |
| 7,520,052 | B2 * | 4/2009 | Takahashi et al. | 29/841 |
| 2008/0206930 | A1 * | 8/2008 | Farnworth | 438/127 |
| 2009/0189310 | A1 | 7/2009 | Takase et al. | |
| 2010/0181667 | A1 * | 7/2010 | Iwase et al. | 257/737 |
| 2010/0308476 | A1 * | 12/2010 | Suga et al. | 257/792 |

* cited by examiner

*Primary Examiner* — William D Coleman
(74) *Attorney, Agent, or Firm* — Slater & Matsil, L.L.P.

(57) ABSTRACT

The method includes providing a plurality of semiconductor chips and placing the plurality of semiconductor chips on a carrier. A compression molding apparatus is provided that includes a first tool and a second tool. The carrier is placed on the first tool of the compression molding apparatus and the semiconductor chips are encapsulated in a mold material by compression molding. During compression molding a heat transfer from the first tool to an upper surface of the carrier is delayed.

22 Claims, 7 Drawing Sheets

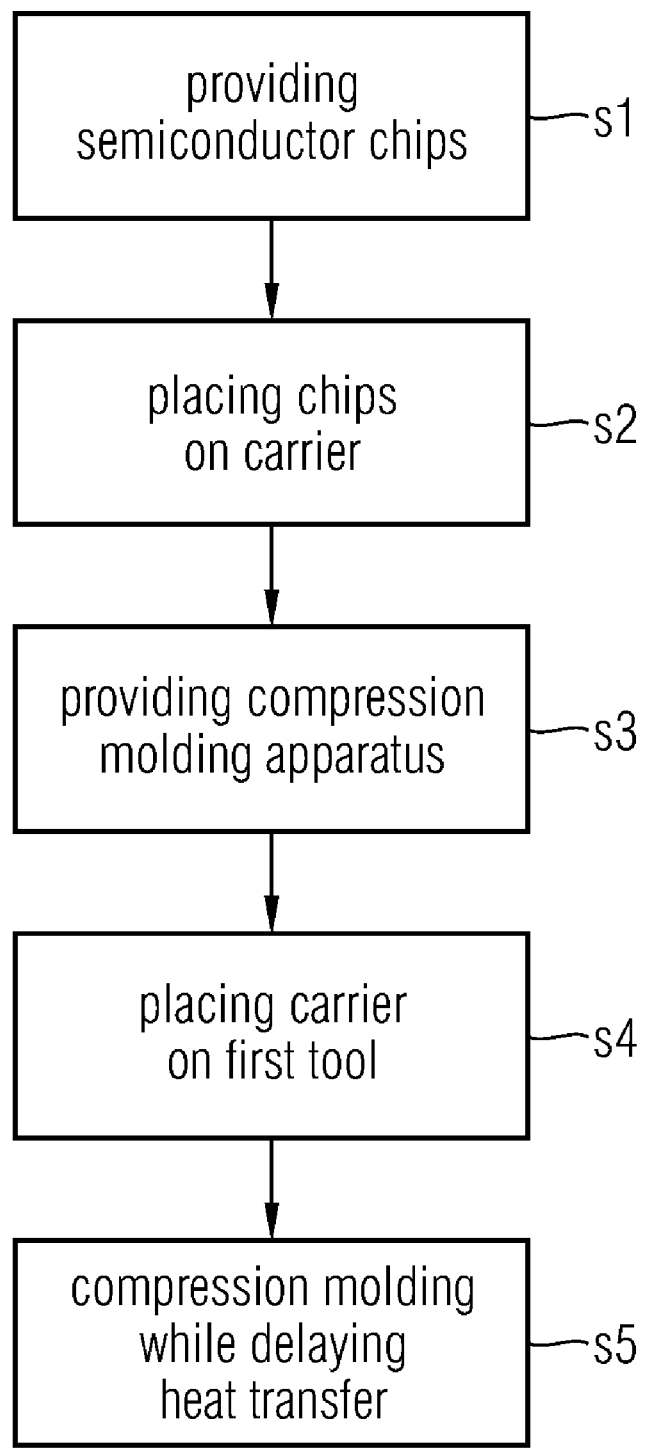

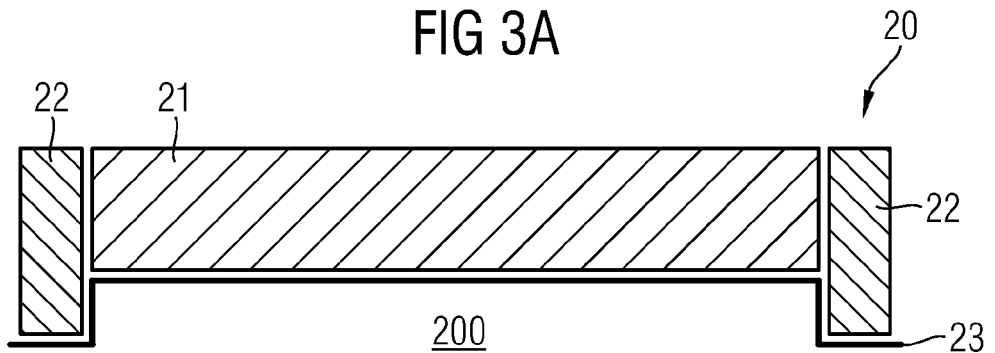
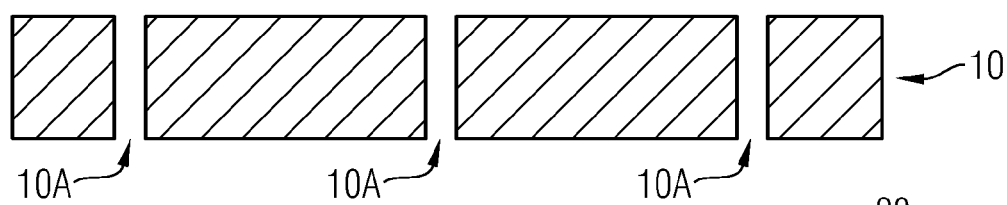
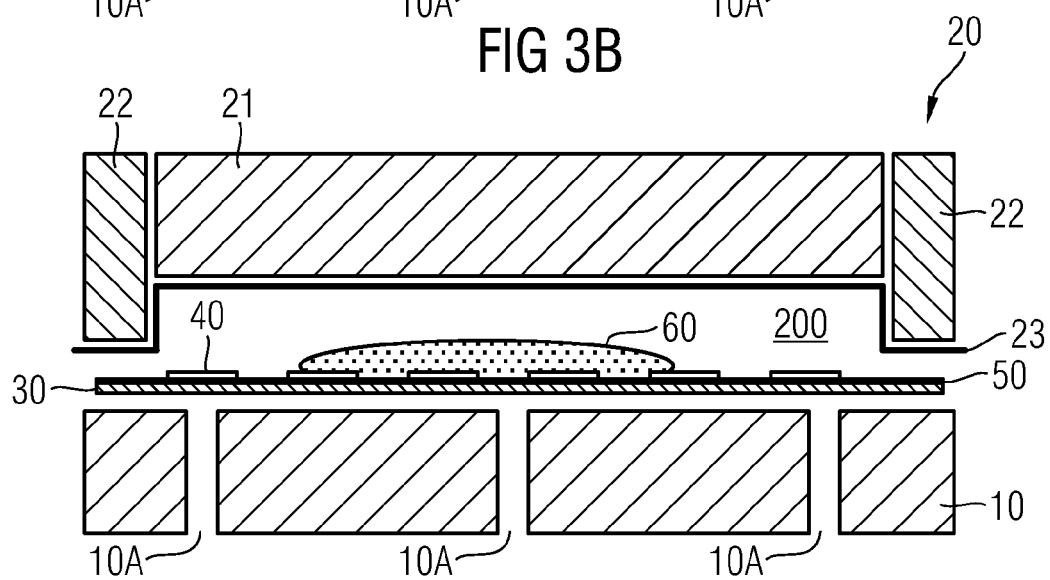
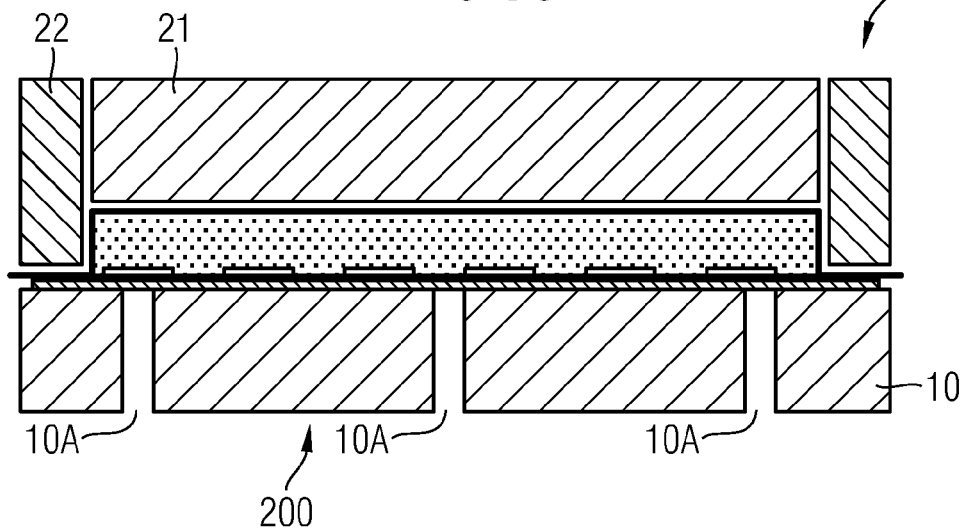

METHOD FOR FABRICATING A SEMICONDUCTOR CHIP PANEL

TECHNICAL FIELD

The present invention is related to a method for fabricating a semiconductor chip panel and a compression molding apparatus.

BACKGROUND

For fabricating semiconductor chip package devices, the so-called Embedded Wafer Level Ball Grid Array (eWLB) technology was developed. In particular, this technology provides a wafer level packaging solution for semiconductor devices requiring a higher integration level and a greater number of external contacts. The eWLB technology is successfully enabling semiconductor manufacturers to provide a small, high performing semiconductor package technology with increased thermal and electrical performance of the individual semiconductor chip package devices. There is, however, a steady demand for an increase in performance, yield and through-put of the packaging process.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 shows a flow diagram of a method for fabricating a semiconductor chip panel according to an embodiment;

FIGS. 3A-3C show schematic cross-sectional side view representations of a compression molding apparatus in successive stages for illustrating a method of FIG. 1 according to an embodiment;

DETAILED DESCRIPTION OF ILLUSTRATIVE EMBODIMENTS

Figure 2A:
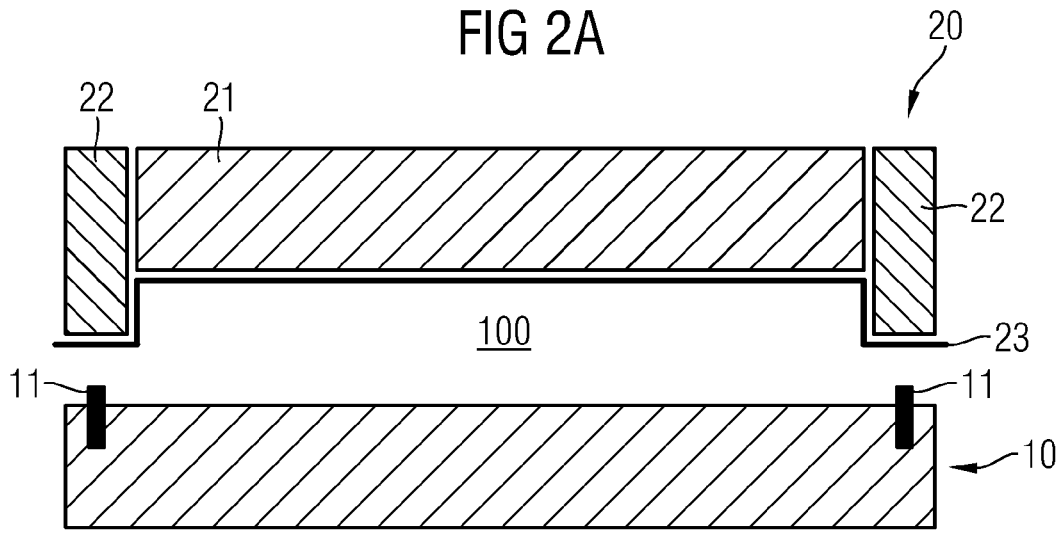
FIGS. 2A-2C show schematic cross-sectional side view representations of a compression molding apparatus in successive stages for illustrating a method of FIG. 1 according to an embodiment.

In the following detailed description, reference is made to the accompanying drawings, which form part hereof, and in which is shown by way of illustration specific embodiments in which the invention may be practiced. In this regard, directional terminology, such as "top", "bottom", "front", "back", "leading", "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements co-operate or interact with each other regardless of whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The devices used there, namely semiconductor chips or semiconductor dies may include contact elements or contact pads on one or more of their outer surfaces wherein the contact elements serve for electrically contacting the respective device to a wireboard, for example. The contact elements may be made from any electrically conducting material, e.g., from a metal such as aluminum, gold, or copper, for example, or a metal alloy, e.g., solder alloy, or an electrically conducting organic material, or an electrically conducting semiconductor material.

The plurality of semiconductor chips will become packaged or covered with an encapsulant material. The encapsulant material can be any electrically insulating material like, for example, any kind of mold material, any kind of epoxy material, or any kind of resin material with or without any kind of filler materials.

In particular, when fabricating the semiconductor chips and the packaging of the semiconductor dies with the encapsulant material, fan-out embedded dies can be fabricated. The fan-out embedded dies can be arranged in an array having the form, e.g., of a wafer and is therefore often called a "reconfigured wafer". However, it should be appreciated that the fan-out embedded die array is not limited to the form and shape of a wafer but can have any size and shape and any suitable array of semiconductor chips embedded therein. This technology is called extended wafer level packaging technology. In the following the semiconductor chips packaged with the encapsulant material will be designated with the general term "semiconductor chip panel."

In the claims and in the following description different embodiments of a method of fabricating a semiconductor device are described as a particular sequence of processes or measures, in particular, in the flow diagrams. It is to be noted that the embodiments should not be necessarily limited to the particular sequence described. Particular ones or all or different processes or measures can also be conducted simultaneously or in any other useful and appropriate sequence.

For fabricating semiconductor chip package devices, compression molding can be used for fabricating an encapsulation layer for embedding the plurality of semiconductor chips. To this end, the individual semiconductor chips are placed on a carrier, in particular by use of an adhesive tape, and a mold material can, for example, be dispensed onto a central portion of the array of semiconductor chips. Thereafter the carrier can then be placed in a compression molding apparatus and within the compression molding apparatus the dispensed mold material can be compression molded and cured to obtain a semiconductor chip encapsulated layer panel. The semiconductor chip panel can then be taken out of the compression molding apparatus for further processing and finally singulating the panel into a plurality of semiconductor chip package devices.

It has been found by the inventors that the temperature of the carrier and of the adhesive layer or adhesive tape attached to the carrier is a crucial parameter in the compression molding process. Roughly speaking, the compression molding process can be divided into three phases which are handling, compression, and curing. On the one hand, it is desirable to apply a relatively high temperature to the carrier in order to accelerate the curing of the mold material. On the other hand, a high temperature may be disadvantageous during the compression molding process as the adhesive properties of any adhesive layer and adhesive tape between the semiconductor chips and the carrier will deteriorate with rising temperature so that chips or dies are likely to be peeled away from the underlying tape or carrier ("flying dies").

It is therefore an essential idea of the present invention to control the temperature at an upper surface of the carrier in such a way that the temperature is higher in the curing phase as compared to the compression phase. To this end, appropriate measures are taken that the temperature at the upper surface of the carrier will start being increased at a particular point in time during compression molding in order to reach a higher temperature at the end of the compression molding phase when the curing phase begins. It will thus be possible to maintain on average a relatively low temperature at the upper surface of the carrier in the compression molding phase and to reach a relatively high temperature on the upper surface of the carrier at the end of the compression molding phase and at the beginning of the curing phase. It is well-known that for many mold materials known in the art the hardening time or curing time increases by a factor of 2 if the temperature increases by 10° C. in the curing phase. On the other hand, the relatively low temperature at the upper surface of the carrier during the compression molding phase allows for stable and reliable encapsulating of the semiconductor chips without the danger of the chips being peeled off from the carrier due to a temperature induced decrease of the adhesion force of the adhesion layer or adhesion tape.

FIG. 1 shows a flow diagram of a method for fabricating a semiconductor chip panel according to an embodiment. The method comprises providing a plurality of semiconductor chips (s1), placing the plurality of semiconductor chips on a carrier (s2), providing a compression molding apparatus comprising a first tool and a second tool (s3), placing the carrier on the first tool of the compression molding apparatus (s4), and encapsulating the semiconductor chips in a mold material by compression molding, wherein during compression molding a heat transfer from the first tool to an upper surface of the carrier is delayed (s5).

In other words, in s5 the heat transfer from the first tool to the carrier or an upper surface thereof is artificially obstructed so that heat can not be easily and quickly transferred from the first tool to an upper surface of the carrier.

According to an embodiment of the method of FIG. 1, the temperature of the first tool is held at a constant level throughout the compression molding process.

According to an embodiment of the method of FIG. 1, a gap is provided between the first tool and the carrier during compression molding. In particular, the gap can be provided during a particular partial phase of the compression molding phase, in particular, an initial phase of the compression molding phase. The gap can be comprised of a vacuum gap as well as a gap filled with any gaseous medium like air. According to a particular embodiment, the first tool of the compression molding apparatus comprises a plurality of pins, e.g., a number of three or four pins extending from an upper surface of the first tool and being insertable into the first tool by a downward force exerted on the pins, wherein the method further comprises placing the carrier on the first tool so that the carrier is situated onto the pins so that a gap is established between a lower surface of the carrier and an upper surface of the first tool, and during compression molding the distance between the first tool and second tool is continuously reduced so that the carrier is moved by the second tool in the direction of the first tool until the pins are inserted into the first tool and the carrier comes to rest with its lower surface onto the upper surface of the carrier. As long as the gap exists, heat transfer between the first tool and the carrier will be obstructed so that, as a result, the heat transfer from the first tool to the upper surface of the carrier will be delayed.

According to a further embodiment, the gap will be generated by pressing air or any other suitable gaseous medium between the upper surface of the first tool and the lower surface of the carrier during a partial phase of the compression molding phase.

According to an embodiment of the method of FIG. 1, a tape is applied onto the carrier and the plurality of semiconductor chips is placed onto the tape.

According to an embodiment of the method of FIG. 1, the carrier itself is constructed in such a way that during compression molding a heat transfer from a lower surface of the carrier to an upper surface of the carrier is obstructed. According to an embodiment thereof, the carrier comprises a lower metallic layer, an upper metallic layer, and an intermediate layer, wherein the intermediate layer comprises a lower heat conductivity than each one of the lower and upper metallic layers.

According to an embodiment of the method of FIG. 1, during compression molding a temperature of an upper surface of the carrier, in particular, of a tape applied onto the upper surface of the carrier is increased, by more than 30%.

More specifically, the temperature rise can be more than 40%, 50%, 60%, 70%, 80%, 90% or even as high as 100%.

According to an embodiment of the method of FIG. 1, at the beginning of the compression molding the temperature of an upper surface of the carrier, in particular, of a tape applied onto the upper surface of the carrier, is below 100° C. In particular, this temperature can be below 95° C., below 90° C., below 85° C., below 80° C., below 75° C., below 70° C., below 65° C., or even below 60° C.

According to an embodiment of the method of FIG. 1, during compression molding in addition a heat transfer from the second tool to an upper surface of the carrier is delayed. In particular, according to an embodiment instead of holding the temperature of the second tool from the beginning on a relatively high temperature, the temperature of the second tool can be increased so that there is a delay in heat transfer to the upper surface of the carrier and the temperature on the upper surface of the carrier is slowly increased.

Figure 2B:
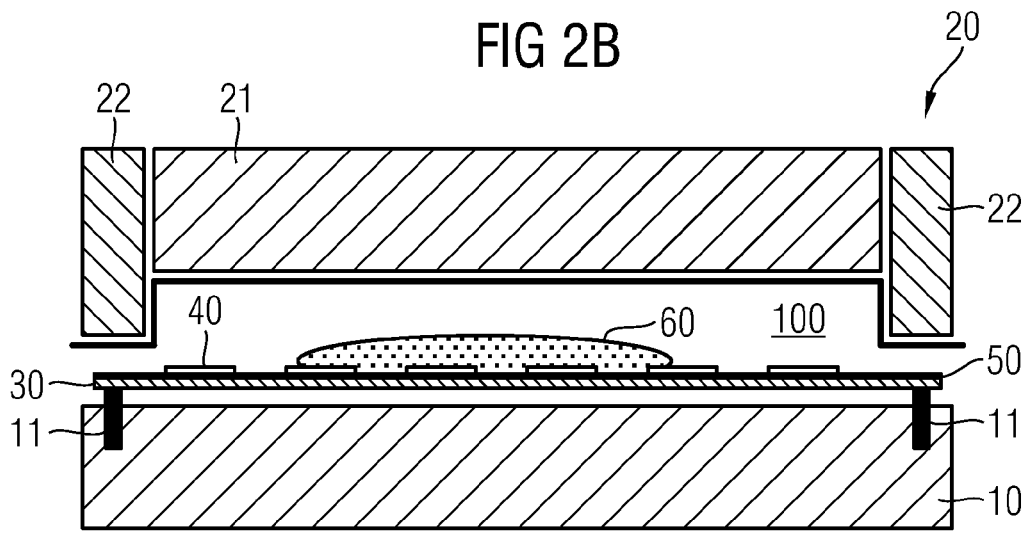
Figure 2C:
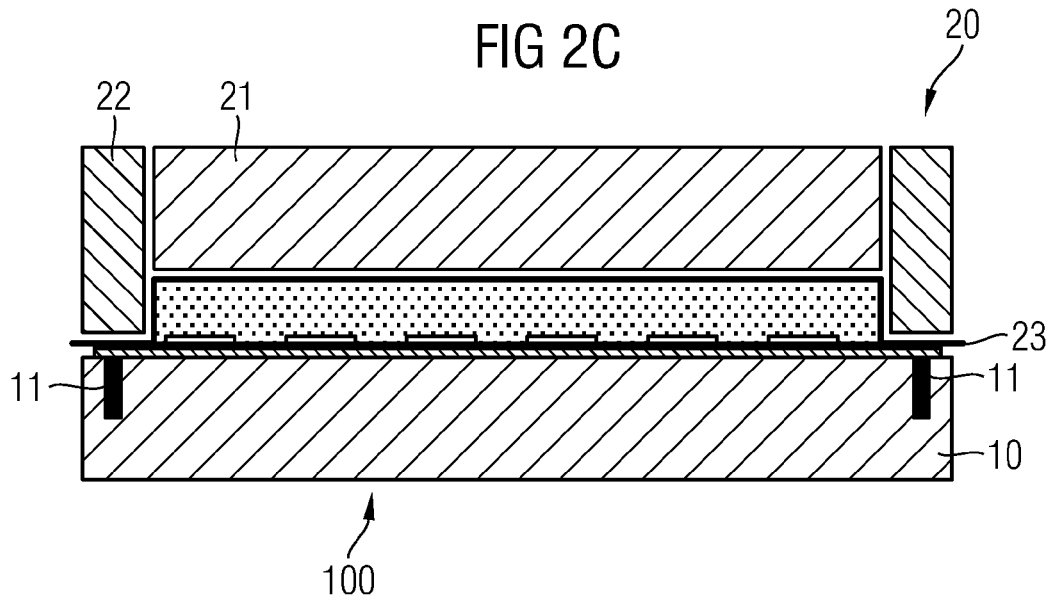

Referring to FIGS. 2A-2C, shown are schematic cross-sectional side view representations of a compression molding apparatus in successive stages for illustrating a method for fabricating a semiconductor chip panel according to a specific embodiment of the embodiment of FIG. 1.

FIG. 2A shows a schematic cross-sectional representation of the compression molding apparatus. The compression molding apparatus 100 comprises a first tool 10, which can be a bottom tool, and a second tool 20, which can be a top tool. The first tool 10 and the second tool 20 are moveable with respect to each other so that they can form an inner cavity which can be sealed from the outside environment. The second tool 20 essentially comprises includes a stamp portion 21 which can be heated to a temperature in the range of between 100° C. and 200° C. The second tool 20 also comprises a resin clamp ring 22 which circularly surrounds the stamp portion 21. Before initiating the compression molding process, a release foil 23 made, for example, of ETFE (ethylen tetra fluorethylen) or of PET (polyethylenterephtalate), is attached to respective lower surfaces of the stamp portion 21 and the resin clamp ring 22. The first tool 10 can be heated to a temperature in a range between 80° C. and 200° C. The first tool 10 comprises a plurality of floating pins 11 which are spring-load mounted within openings formed in the upper surface of the first tool 10. The spring-load mounting of the pins 11 is such that in their normal position the pins 11 extend with their upper portion from the upper surface of the first tool 10 in the direction of the second tool 20, but when exerting a downward vertical force upon the pins 11, the pins 11 can be completely vertically inserted into the holes formed within the upper surface of the first tool 10. In an end position of the compression molding process the resin clamp ring 22 of the second tool 20 exerts a vertical downward force upon the pins 11 and presses them into the first tool 10, as will be seen later. As an example, in case of a circularly shaped first tool 10, a number of four pins 11 can be arranged so that the pins are located in an edge portion of the first tool 10 at equally spaced angular positions with respect to the center of the first tool 10. A number of three pins 11 would also be sufficient for the purpose of this embodiment.

FIG. 2B shows the compression molding apparatus 100 in the next stage where a carrier 30 supplied with semiconductor chips 40 has been placed on the pins 11 of the first tool 10. The carrier 30 is, for example, comprised of a circular metallic substrate. Before placing the carrier in the compression molding apparatus 100, an adhesive tape 50 is attached to an upper surface of the carrier 30. Thereafter a plurality of semiconductor chips 40 is placed on an upper surface of the tape 50 by means of, for example, a pick-and-place machine. The semiconductor chips 40 are placed according to a predetermined arrangement with sufficient intermediate spaces between the individual semiconductor chips 40 so as to allow the fabrication of semiconductor package devices with desirable fan-out of the electrical contact pads. Thereafter, a predetermined amount of mold material 60 is dispensed onto a central portion of the carrier 30 and a respective part of the semiconductor chips 40. Thereafter, the carrier 30 is placed onto the pins 11 of the first tool 10 in the compression molding apparatus 100.

In operation of the compression molding apparatus 100, the distance between the first tool 10 and the second tool 20 is reduced, in particular, the second tool 20 moves downward until the resin clamp ring 22 with the underlying release foil 23 rests on an outer ring-like edge of the carrier 30. Alternatively also the first tool 10 can be moved upwards in the direction of the top tool 20. The inner space defined by the second tool 20 and the carrier 30 will now be evacuated and compression molding begins in a situation in which, due to the pins 11, a gap exists between the carrier 30 and the upper surface of the first tool 10. For this reason, at this stage no significant heat connection exists between the first tool 10 and the carrier 30 and therefore no significant heat transfer will occur. Meanwhile the second tool 20 keeps on pressing downwardly onto the carrier 30 such that the pressing force exceeds the oppositely directed pre-load force of the springs in the openings of the pins 11. As a result the second tool 20 will press the carrier 30 against the spring-load forces of the pins 11 downwards until the carrier 30 will rest with its lower surface upon the upper surface of the first tool 10.

Referring to FIG. 2C, the compression molding apparatus 100 is shown in its end position in which the carrier 30 rests with its lower surface upon the upper surface of the first tool 10 so that there is optimum heat connection between the first tool 10 and the carrier 30 and the mold material 60 so that curing or hardening of the mold material 60 can occur under optimum high temperature conditions. After curing of the mold material 60, the compression molding apparatus 100 can be opened and the carrier system together with the semiconductor chip panel can be taken out.

Referring to FIGS. 3A-3C shown are schematic cross-sectional representations of a compression molding apparatus for illustrating a method for fabricating a semiconductor chip panel according to FIG. 1 and according to a further embodiment. As far as the same reference numerals are used as in the embodiment of FIGS. 2A-2C, the same or functionally the same technical features are designated therewith and are not repeatedly described here.

FIG. 3A shows a compression molding apparatus 200 comprising a first tool 10 and a second tool 20. The first tool 10 includes a plurality of through-borings 10A which are connected at their respective lower inlet ports at the lower surface of the first tool 10 with an air supply device (not shown).

FIG. 3B shows the compression molding apparatus 200 after placing the carrier 30 on the first tool 10 of the compression molding apparatus 200. FIG. 3B thus depicts a situation equivalent to that one of FIG. 2B of the previous embodiment. In the present case no floating pins exist to hold the carrier 30 in a position wherein a gap exists between carrier 30 and the upper surface of first tool 10. Instead air is blown through the through-borings 10A to form an air layer between the upper surface of first tool 10 and the lower surface of carrier 30 so that the carrier 30 is supported by the air layer in a small distance from the first tool 10.

In the following a scenario similar to that one of the embodiment of FIGS. 2A-2C occurs in which the second tool 20 is pressed downwards until the resin clamp ring 22 with the underlying release foil 23 rests upon an outer edge of the upper surface of carrier 30 so that afterwards a vacuum can be generated in the inner cavity defined by second tool 20 and carrier 30 and compression molding can be initiated. Meanwhile the second tool 20 keeps on pressing carrier 30 downward in the direction of first tool 10 and exceeds the oppositely directed resilient force of the air layer situated between the first tool 10 and the carrier 30. In a final position the carrier 30 comes to rest on the upper surface of first tool 10.

FIG. 3C is similar to the situation as shown in FIG. 2C of the previous embodiment wherein the second tool 20 has now completely pressed down onto the carrier 30 onto the upper surface of the first tool 10 so that optimum heat connection is established from first tool 10 to carrier 30 and the mold material 60.

As was shown above and explained in connection with the embodiments of FIGS. 2A-2C and FIGS. 3A-3C, at the beginning of and during an initial phase of the compression molding phase a gap is established between the lower surface of carrier 30 and the upper surface of first tool 10. The gap is schematically shown in FIG. 2C and FIG. 3C wherein the dimensions shown in these figures are not to scale. In fact the gap can have a height in a range between 10 µm and 100 µm, in particular, 30 µm to 70 µm, 40 µm to 60 µm, or a value of or around 50 µm.

Also in connection with FIGS. 2A-2C and FIGS. 3A-3C, according to a further embodiment the first tool 10 and the second tool 20 are held on constant temperatures each. Whereas the first tool 10 is held at a constant temperature in a range in-between 80° C. and 200° C., the second tool 20 is held at a constant temperature in a range in-between 100° C. and 180° C.

Figure 4:
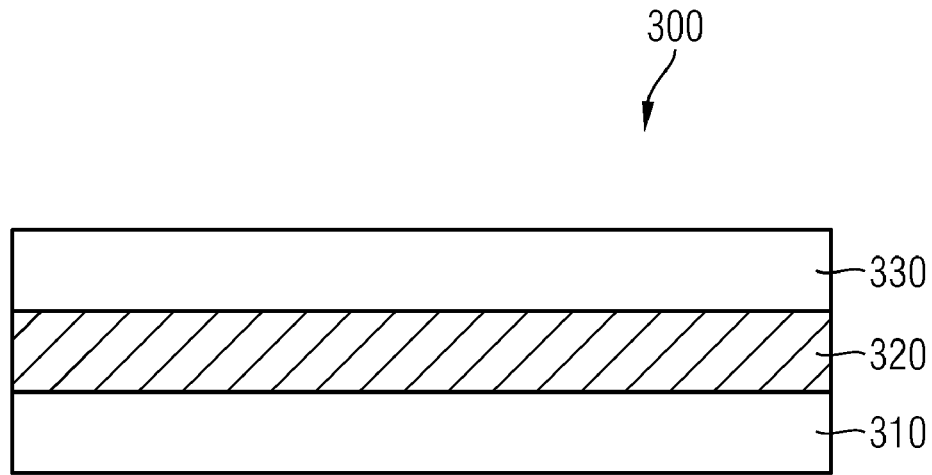
FIG. 4 shows a schematic cross-sectional side view representation of a carrier for illustrating a method of FIG. 1 according to an embodiment.

Referring to FIG. 4, there is shown a schematic cross-sectional side view representation of a carrier for illustrating a method of FIG. 1 according to an embodiment. The carrier 300 is essentially comprised of a layer stack consisting of a first layer 310, a second layer 320, and a third layer 330. The second, intermediate layer 320 includes a lower heat conductivity than each one of the first and third layers 310 and 330. The first and third layers 310 and 330 can, for example, be comprised of metallic layers. The carrier 300 can be used in principle in the same way as the carriers 30 in the embodiments of FIGS. 2A-2C and 3A-3C. In this case, however, the carrier 300 itself would serve for the delay in heat transfer from the first tool to the upper surface of the carrier. The carrier 300 would be placed into a compression molding apparatus together with a plurality of semiconductor chips placed on its upper surface or on an adhesive tape attached to its upper surface. In contrast to the embodiments of FIGS. 2A-2C and FIGS. 3A-3C, the carrier 300 would be placed from the beginning directly upon the first tool which could be held on a constant temperature in the range between 80° C. and 180° C. The delay of heat transfer from the first tool to the upper surface of the carrier 300 is due to the second intermediate layer 320 of low heat conductivity. At the beginning of the compression molding phase, i.e., when the carrier 300 was just placed onto the first tool, the upper surface of the carrier 300 is still on a relatively low temperature as the second intermediate layer 320 of the carrier 300 blocks the heat flow from the first tool via the first layer 310 to the third layer 330. Only after a certain amount of time has sufficient heat been transferred through the second intermediate layer 320 so that the third layer 330 will at least approximately reach the temperature of the first tool. Therefore, the carrier 300 itself serves for a delay of heat transfer from the first tool to the upper surface of the carrier 300. In this embodiment it will thus be not necessary to establish a gap between the carrier and the first tool as was the case in the embodiments of FIGS. 2A-2C and FIGS. 3A-3C.

Figure 5:
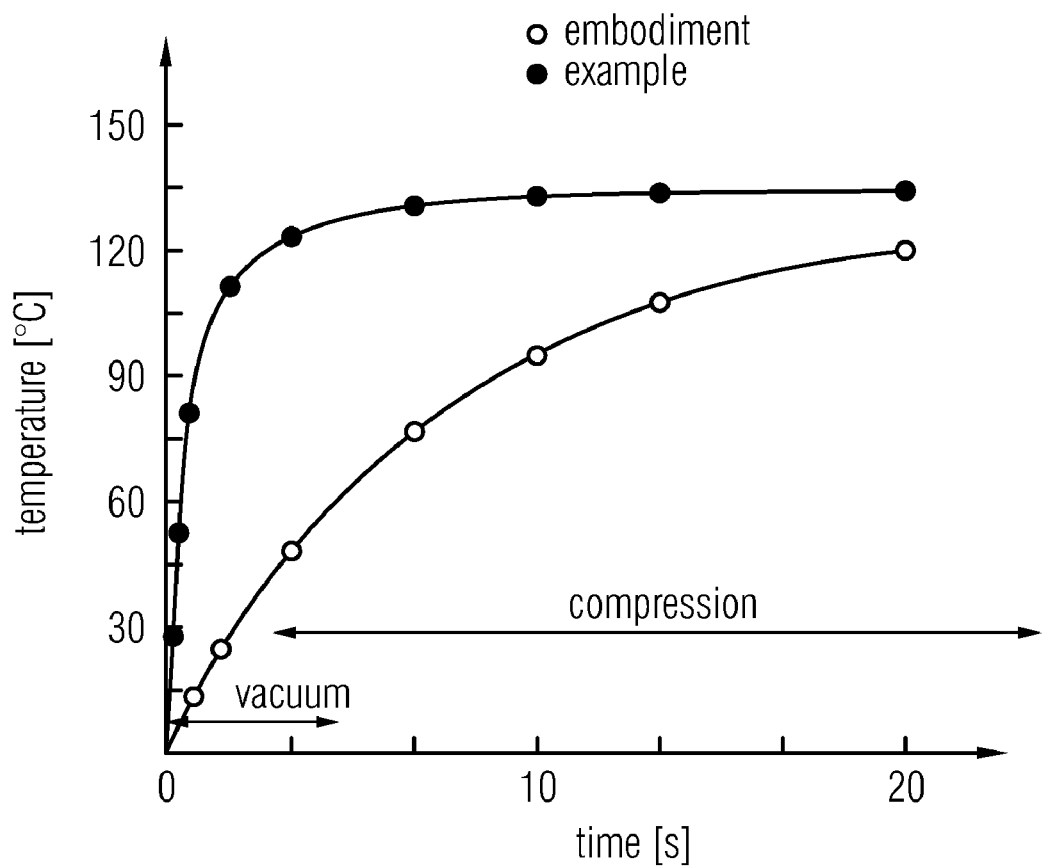
FIG. 5 shows a diagram plotting the temperature over time at the adhesive tape according to an embodiment and a comparative example.

Referring to FIG. 5, there is shown a diagram plotting the measured temperature of an adhesive tape attached to the upper surface of the carrier versus the time in a compression molding process for two different configurations. Two curves are shown in the diagram of FIG. 5, one of which (open circles) is related to an embodiment in which an air gap of a height of 50 µm is established, in particular, by one of the embodiments as shown in FIGS. 2A-2C and FIGS. 3A-3C. The other curve (full circles) is related to an example which does not form a part of the invention and in which no gap and no delay in heat transfer at all is established between the carrier and the first tool throughout the whole compression molding process. In the diagram of FIG. 5 the curve of the example shows an initial steep increase of the temperature of the tape over time due to the optimum heat transfer between the first tool and the carrier. After about 5 seconds the curve reaches a saturation level approaching an upper temperature close to the temperature of the first tool. This means that at the beginning of the compression molding phase, i.e., 5 seconds after starting to establish the vacuum, the temperature is rather high so that the adhesion force of the tape may deteriorate together with an increased danger of peeling off of the semiconductor chips. On the other hand, the curve of the embodiment shows a smooth increase of temperature so that during the compression molding phase the danger of peeling off of the semiconductor chips or the tape can be significantly reduced. It can be seen that at the beginning of the compression molding phase the temperature is slightly below 60° C. and the temperature rises during the compression molding phase by almost 100% until it reaches its final level.

Figure 6:
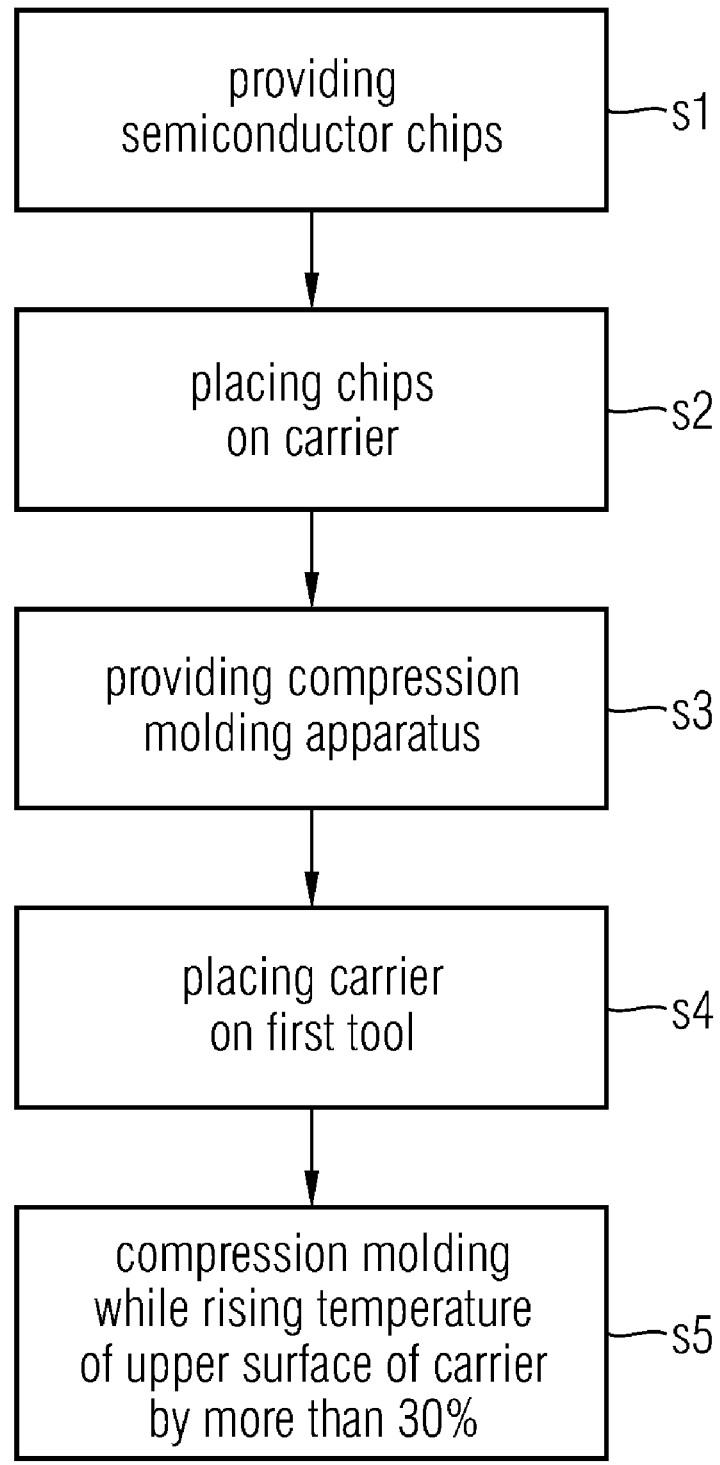
FIG. 6 shows a flow diagram of a method for fabricating a semiconductor chip panel according to an embodiment.

Referring to FIG. 6, there is shown a flow diagram of a method for fabricating a semiconductor chip panel according to an embodiment. The method includes providing a plurality of semiconductor chips (s1), placing the plurality of semiconductor chips on a carrier (s2), providing a compression molding apparatus comprising a first tool and a second tool (s3), placing the carrier on the first tool of the compression molding apparatus (s4), and encapsulating the semiconductor chips in a mold material by compression molding, wherein during compression molding a temperature of an upper surface of the carrier rises by more than 30% (s5).

According to an embodiment, an adhesive tape is attached to the upper surface of the carrier and the semiconductor chips are placed onto the adhesive tape, which means that the temperature of the adhesive tape is smoothly increased during the compression molding phase from a relatively low level to a relatively high level at the end of the compression molding phase.

According to an embodiment of the method of FIG. 6, the temperature rise during the compression molding phase can also be more than 40%, 50%, 60%, 70%, 80%, or 90%.

According to an embodiment of the method of FIG. 6, at the beginning of the compression molding phase the temperature of an upper surface of the carrier, in particular, the temperature of a tape attached to the carrier, is below 100° C. The temperature can be even lower than that, in particular, below 95° C., 90° C., 85° C., 80° C., 75° C., 70° C., below 65° C., or below 60° C.

Other embodiments of the method according to the embodiment of FIG. 6 can be formed along the embodiments or features which were described above in connection with FIG. 1.

Figure 7:
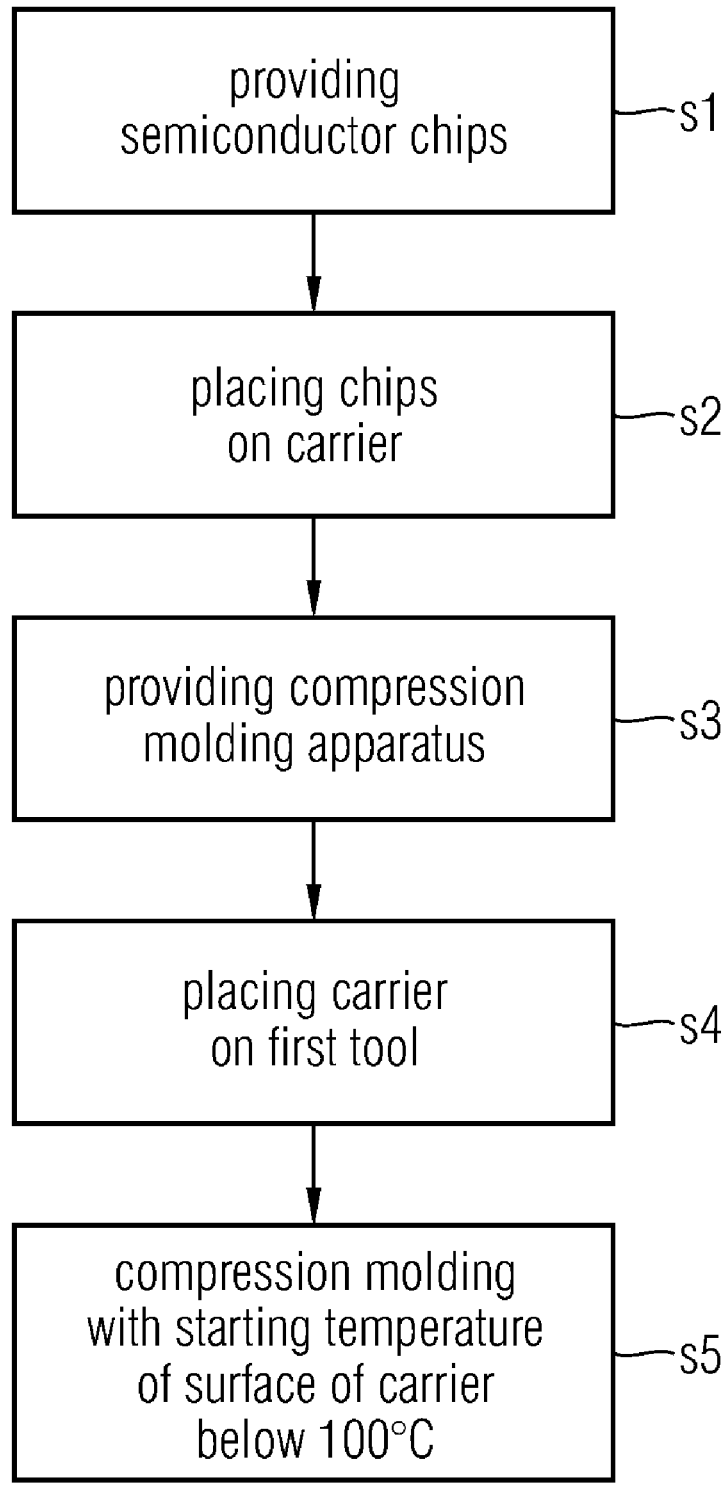
FIG. 7 shows a flow diagram of a method for fabricating a semiconductor chip panel according to an embodiment.

Referring to FIG. 7, there is shown a flow diagram of a method for fabricating a semiconductor chip panel according to an embodiment. The method includes providing a plurality of semiconductor chips (s1), placing the plurality of semiconductor chips on a carrier (s2), providing a compression molding apparatus, the compression molding apparatus comprising a first tool and a second tool (s3), placing the carrier on the first tool of the compression molding apparatus (s4), and encapsulating the semiconductor chips in a mold material by compression molding, wherein at the beginning of the compression molding the temperature of an upper surface of the carrier is below 100° C. (s5).

Further embodiments of the methods of FIG. 7 can be formed along embodiments and features as were described above in connection with FIG. 1 or 6.

Figure 8:
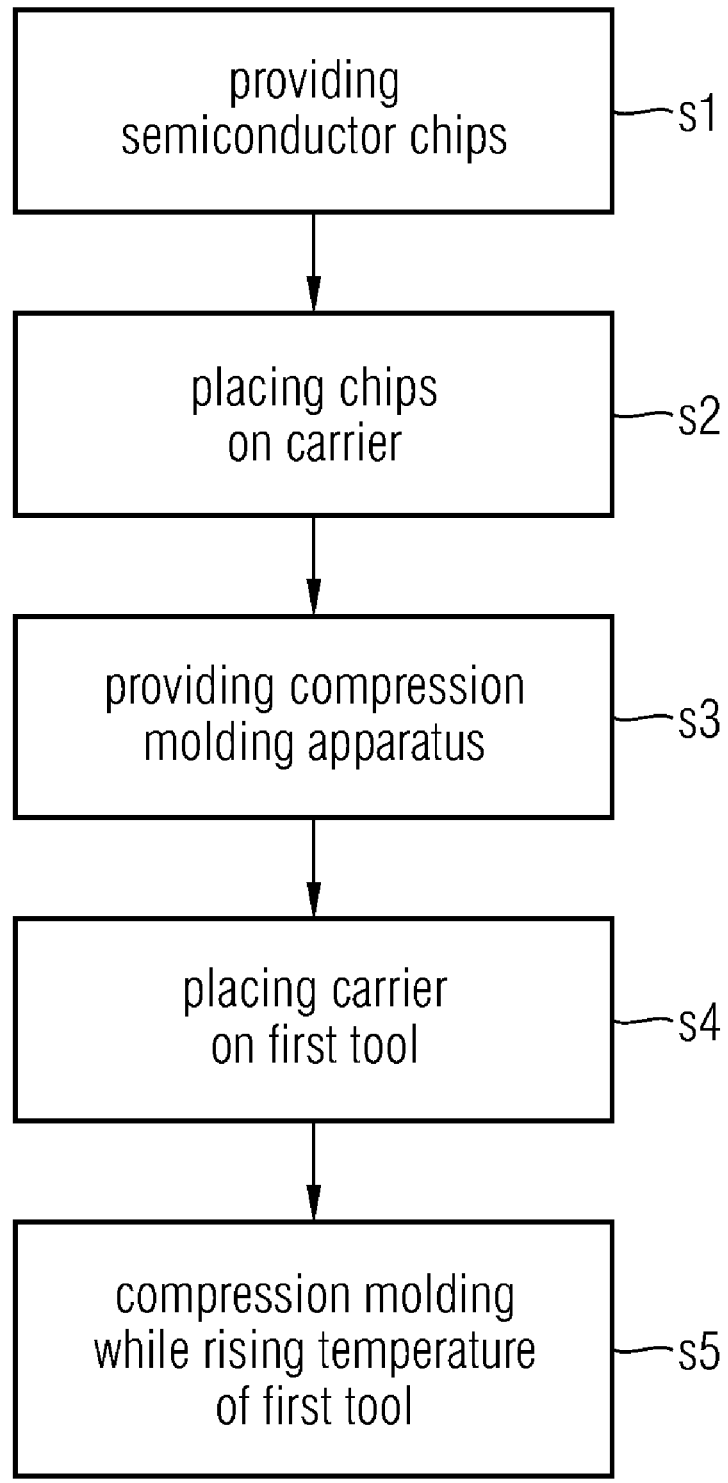
FIG. 8 shows a flow diagram of a method for fabricating a semiconductor chip panel according to an embodiment.

Referring to FIG. 8, there is shown a flow diagram for illustrating a method for fabricating a semiconductor chip panel according to an embodiment. The method includes providing a plurality of semiconductor chips (s1), placing the plurality of semiconductor chips on a carrier (s2), providing a compression molding apparatus comprising a first tool and a second tool (s3), placing the carrier on the first tool of compression molding apparatus (s4), and encapsulating the semiconductor chips in a mold material by compression molding, wherein during compression molding a temperature of the first tool is increased (s5).

According to an embodiment of the method of FIG. 8, the heat transfer from the first tool to the carrier is not artificially obstructed or delayed as was the case in the embodiment of FIG. 1. The temperature of the first tool can be, for example, increased in such a way that the temperature at the upper surface of the carrier or at the tape attached to the carrier will follow the curve of the embodiment as shown in FIG. 5 (open circles).

According to an embodiment of the method of FIG. 8, at the beginning of the compression molding the temperature of the first tool can be $T_1 \geqq 80°$ C., and during the compression molding the temperature of the first tool can be increased to $T_2 \leqq 180°$ C.

According to an embodiment of the method of FIG. 8, during compression molding in addition a heat transfer from the second tool to an upper surface of the carrier is delayed. In particular, according to an embodiment instead of holding the temperature of the second tool from the beginning on a relatively high constant temperature, the temperature of the second tool can be increased from a relatively low temperature to a relatively high temperature so that there is a delay in heat transfer to the upper surface of the carrier and the temperature on the upper surface of the carrier is slowly increased. More specifically, at the beginning of the compression molding the temperature of the second tool can be $T_3 \geqq 80°$ C., and during the compression molding the temperature of the second tool can be increased to $T_4 \leqq 180°$ C.

A further embodiment is directed to a compression molding apparatus which comprises a first tool and a second tool, a first heating device to heat the first tool, and a heat flow delay element to delay heat flow to a surface of the first tool, or alternatively a heat timer connected with the first heating device to heat the first tool according to a particular time function. The compression molding apparatus therefore either comprises a heat flow delay element or a heat timer. If it comprises a heat flow delay element, it may work according to a method as depicted in one of the FIG. 1-4, 6 or 7, and if it comprises a heat timer it may work according to a method as depicted in FIG. 8. In particular, the heat flow delay element can, for example, be comprised of a plurality of pins 11 as shown in FIGS. 2A-C or it can be comprised of the through-borings 10A in the first tool 10 as depicted in FIGS. 3A-C together with a suitable device for pressing air through the through-borings 10A for generating an air layer above the first tool 10. The heat flow delay element can also be comprised of a carrier such as that depicted in FIG. 4. If a heat timer is used instead of a heat flow delay element, the heat timer can be adjusted such that it slowly rises the temperature of the first tool as described, for example, in previous embodiments herein. It is also possible to employ both a heat flow delay element and a heat timer in a compression molding apparatus according to a further embodiment.

What is claimed is:

1. A method for fabricating a semiconductor chip panel, the method comprising:
    providing a plurality of semiconductor chips;
    placing the semiconductor chips on a carrier;
    providing a compression molding apparatus comprising a first tool and a second tool;
    placing the carrier on the first tool of the compression molding apparatus; and
    encapsulating the semiconductor chips in a mold material by compression molding, wherein during compression molding a heat transfer from the first tool to an upper surface of the carrier is delayed, wherein during the compression molding:
        providing a gap between the first tool and the carrier during compression molding, and
        pressing air between an upper surface of the first tool and a lower surface of the carrier during compression molding.

2. A method for fabricating a semiconductor chip panel, the method comprising:
    providing a plurality of semiconductor chips;
    placing the semiconductor chips on a carrier;
    providing a compression molding apparatus comprising a first tool and a second tool, wherein the first tool of the compression molding apparatus comprises a plurality of pins extending from an upper surface of the first tool and being insertable into the first tool;
    placing the carrier on the first tool of the compression molding apparatus so that the carrier is situated onto the pins so a gap is established between a lower surface of the carrier and the upper surface of the first tool; and
    encapsulating the semiconductor chips in a mold material by compression molding, wherein during compression molding a heat transfer from the first tool to an upper surface of the carrier is delayed, wherein during compression molding, a distance between the first tool and the second tool is reduced until the pins are inserted into the first tool and the carrier comes to rest with its lower surface at the upper surface of the first tool.

3. A method for fabricating a semiconductor chip panel, the method comprising:
    providing a plurality of semiconductor chips;
    placing the semiconductor chips on a carrier;
    providing a compression molding apparatus comprising a first tool and a second tool,
    placing the carrier on the first tool of the compression molding apparatus, wherein the carrier comprises a lower metallic layer, an upper metallic layer, and an intermediate layer, wherein the intermediate layer comprises a lower heat conductivity than each one of the lower and upper metallic layers; and
    encapsulating the semiconductor chips in a mold material by compression molding, wherein during compression molding a heat transfer from the first tool to an upper surface of the carrier is delayed.

4. The method according to claim 3, wherein the carrier is constructed in such a way that during compression molding a heat transfer from a lower surface of the carrier to the upper surface of the carrier is obstructed.

5. The method according to claim 3, wherein a temperature of the upper surface of the carrier rises by more than 30% during compression molding, wherein at a start of the compression molding, the temperature of the upper surface of the carrier is above room temperature.

6. A method for fabricating a semiconductor chip panel, the method comprising:
providing a plurality of semiconductor chips;
placing the semiconductor chips on a carrier;
providing a compression molding apparatus comprising a first tool and a second tool;
placing the carrier on the first tool of the compression molding apparatus; and
encapsulating the semiconductor chips in a mold material by a compression molding process, wherein during the compression molding process a temperature of an upper surface of the carrier rises by more than 30%, wherein during a portion of the compression molding process blowing air between an upper surface of the first tool and a lower surface of the carrier to form a gap between the first tool and the carrier.

7. The method according to claim 6, wherein the temperature of the upper surface of the carrier is below 100° C. at the beginning of the compression molding.

8. The method according to claim 6, wherein a temperature of the first tool is increased during the compression molding.

9. The method according to claim 6, wherein a gap is provided between the first tool and the carrier during compression molding.

10. The method according to claim 6, wherein the carrier is constructed in such a way that a heat transfer from a lower surface of the carrier to the upper surface of the carrier is delayed during compression molding.

11. The method according to claim 6, wherein the carrier comprises a lower metallic layer, an upper metallic layer, and an intermediate layer, wherein the intermediate layer comprises a lower heat conductivity than each one the lower and upper metallic layers.

12. A method for fabricating a semiconductor chip panel, the method comprising:
providing a plurality of semiconductor chips;
placing the semiconductor chips on a carrier;
providing a compression molding apparatus comprising a first tool and a second tool, wherein the first tool of the compression molding apparatus comprises a plurality of pins extending from an upper surface of the first tool and being insertable into the first tool;
placing the carrier on the first tool of the compression molding apparatus so that the carrier is situated onto the pins and a gap is established between a lower surface of the carrier and the upper surface of the first tool; and
encapsulating the semiconductor chips in a mold material by a compression molding process, wherein during the compression molding process a temperature of an upper surface of the carrier rises by more than 30%, wherein during the compression molding process, a distance between the first tool and the second tool is reduced until the pins are inserted into the first tool and the carrier comes to rest with its lower surface on the upper surface of the first tool.

13. A method for fabricating a semiconductor chip panel, the method comprising:
providing a plurality of semiconductor chips;
placing the semiconductor chips on a carrier;
providing a compression molding apparatus, the compression molding apparatus comprising a first tool and a second tool;
placing the carrier on the first tool of the compression molding apparatus; and
encapsulating the semiconductor chips in a mold material by compression molding, wherein at a beginning of the compression molding a temperature of an upper surface of the carrier is above room temperature but below 100° C.

14. The method according to claim 13, wherein a temperature of the first tool is increased during compression molding.

15. The method according to claim 13, wherein a heat transfer from the first tool to the upper surface of the carrier is delayed during compression molding.

16. The method according to claim 13, wherein a gap is provided between the first tool and the carrier during compression molding.

17. The method according to claim 13, further comprising pressing air between an upper surface of the first tool and a lower surface of the carrier during compression molding.

18. The method according to claim 13, wherein the carrier is constructed in such a way that a heat transfer from a lower surface of the carrier to the upper surface of the carrier is delayed during compression molding.

19. The method according to claim 18, wherein the carrier comprises a lower metallic layer, an upper metallic layer, and an intermediate layer, wherein the intermediate layer comprises a lower heat conductivity than each one the lower and upper metallic layers.

20. A method for fabricating a semiconductor chip panel, the method comprising:
providing a plurality of semiconductor chips;
placing the semiconductor chips on a carrier;
providing a compression molding apparatus, the compression molding apparatus comprising a first tool and a second tool;
placing the carrier on the first tool of the compression molding apparatus; and
encapsulating the semiconductor chips in a mold material by compression molding, wherein a temperature of the first tool is increased during compression molding, wherein at a beginning of the compression molding the temperature of the first tool comprises a value $T_1 \geq 80°$ C., and wherein during the compression molding the temperature of the first tool is increased to a value $T_2 \leq 180°$ C.

21. A compression molding apparatus, comprising:
a first tool and a second tool, the first tool comprising a plurality of pins extending from an upper surface of the first tool and being insertable into the first tool;
a first heating device to heat the first tool; a heat flow delay element to delay heat flow to a surface of the first tool, or alternatively a heat timer connected with the first heating device to heat the first tool according to a particular time function; and
a first configuration in which the first tool of the compression molding apparatus is placed adjacent a carrier so that the carrier is situated onto the plurality of pins so a gap is established between a lower surface of the carrier and the upper surface of the first tool, wherein the compression molding apparatus is configured to reduce a distance between the first tool and the second tool during a compression molding process until the plurality of pins are inserted into the first tool and a carrier comes to rest with its lower surface on the upper surface of the first tool.

22. A compression molding apparatus, comprising:

a first tool and a second tool, the first tool comprising holes configured to pass air from a bottom side of the first tool to an opposite top side of the first tool;

a first heating device to heat the first tool; and a heat flow delay element to delay heat flow to a surface of the first tool, or alternatively a heat timer connected with the first heating device to heat the first tool according to a particular time function.

* * * * *